(12) United States Patent
Kyung et al.

(10) Patent No.: US 10,153,783 B2
(45) Date of Patent: Dec. 11, 2018

(54) LOW DENSITY PARTY CHECK (LDPC) DECODER AND METHOD OF DECODING PERFORMED BY LDPC DECODER IN DIGITAL VIDEO BROADCASTING (DVB) SYSTEM

(71) Applicant: Samsung Electronics Co., Ltd., Suwon-si (KR)

(72) Inventors: Gyu Bum Kyung, Seoul (KR); Jae Wook Shim, Yongin-si (KR); Ho Yang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 327 days.

(21) Appl. No.: 14/477,177

(22) Filed: Sep. 4, 2014

(65) Prior Publication Data
US 2015/0082116 A1    Mar. 19, 2015

(30) Foreign Application Priority Data
Sep. 16, 2013    (KR) .................. 10-2013-0110918

(51) Int. Cl.
*H03M 13/00*    (2006.01)
*H03M 13/11*    (2006.01)
*H03M 13/37*    (2006.01)

(52) U.S. Cl.
CPC ...... *H03M 13/1165* (2013.01); *H03M 13/112* (2013.01); *H03M 13/1117* (2013.01); *H03M 13/1125* (2013.01); *H03M 13/3707* (2013.01); *H03M 13/658* (2013.01); *H03M 13/6583* (2013.01)

(58) Field of Classification Search
CPC . H03M 13/1105; H03M 13/1114; G06F 11/10
See application file for complete search history.

(56) References Cited

U.S. PATENT DOCUMENTS

| 7,246,304 | B2* | 7/2007 | Kim ...................... H03M 13/05 714/801 |
| 7,350,130 | B2* | 3/2008 | Tran ................... H03M 13/1117 714/758 |
| 7,770,090 | B1* | 8/2010 | Kons .................. H03M 13/1137 714/780 |
| 7,900,126 | B2* | 3/2011 | Sun .................... H03M 13/1117 714/801 |

(Continued)

OTHER PUBLICATIONS

Anastasopoulos, Achilleas. "A comparison between the sum-product and the min-sum iterative detection algorithm based on density evolution," in Proc. IEEE GLOBECOM (2001): 1021-1025.

(Continued)

*Primary Examiner* — Esaw T Abraham
(74) *Attorney, Agent, or Firm* — NSIP Law

(57) ABSTRACT

A low density parity check (LDPC) decoder, including a memory configured to store a log-likelihood ratio (LLR) value of bits output from a demapper, and an LLR message exchanged between a variable node and an inspection node. The LDPC decoder further includes a node processor configured to select a decoding algorithm from a first algorithm and a second algorithm based on a code rate of an LDPC code, and decode the LLR message based on the selected decoding algorithm.

7 Claims, 8 Drawing Sheets

(56) References Cited

U.S. PATENT DOCUMENTS

| | | | | |
|---|---|---|---|---|
| 8,078,933 B2* | 12/2011 | Bates | ............... | H03M 13/1105 |
| | | | | 714/752 |
| 8,230,312 B1* | 7/2012 | Yeo | ............... | H03M 13/1117 |
| | | | | 714/795 |
| 8,321,772 B1* | 11/2012 | Yeung | ............... | H04L 1/0054 |
| | | | | 714/795 |
| 8,595,590 B1* | 11/2013 | Vojcic | ............... | H04L 1/0041 |
| | | | | 375/262 |
| 8,601,352 B1* | 12/2013 | Anholt | ............... | G06F 11/10 |
| | | | | 714/752 |
| 8,650,459 B1* | 2/2014 | Lee | ............... | H04L 1/0054 |
| | | | | 714/759 |
| 8,719,670 B1* | 5/2014 | Marrow | ............... | G06F 11/1072 |
| | | | | 714/755 |
| 8,935,598 B1* | 1/2015 | Norrie | ............... | H03M 13/6583 |
| | | | | 375/262 |
| 9,191,256 B2* | 11/2015 | Vojcic | ............... | H04L 1/005 |
| 2003/0023917 A1 | 1/2003 | Richardson et al. | | |
| 2009/0074112 A1 | 3/2009 | Coersmeier et al. | | |

OTHER PUBLICATIONS

Hu, Xiao-Yu, et al. "Efficient implementation of the sum—product algorithm for decoding LDPC codes," in Proc. IEEE GLOBECOM (2001):1036-1036E (6 pages, in English).

Chen, Jinghu, et al. "Density evolution for two improved BP-based decoding algorithms of LDPC codes." Communications Letters, IEEE vol. 6. No. 5 (2002): 208-210.

Mansour, Mohammad M., et al. "High-throughput LDPC decoders." Very Large Scale Integration (VLSI) Systems, IEEE Transactions on vol. 11. No. 6 (2003): 976-996.

* cited by examiner

500

LOW DENSITY PARTY CHECK (LDPC) DECODER AND METHOD OF DECODING PERFORMED BY LDPC DECODER IN DIGITAL VIDEO BROADCASTING (DVB) SYSTEM

CROSS-REFERENCE TO RELATED APPLICATION

This application claims the benefit under 35 USC 119(a) of Korean Patent Application No. 10-2013-0110918, filed on Sep. 16, 2013, in the Korean Intellectual Property Office, the entire disclosure of which is incorporated herein by reference for all purposes.

BACKGROUND

1. Field

The following description relates to a low density parity check (LDPC) decoder and a method of decoding performed by the LDPC decoder in a digital video broadcasting (DVB) system.

2. Description of Related Art

A digital video broadcasting (DVB) system is utilized in various fields of application. For example, DVB-satellite-second generation (S2) refers to a transmission/reception standard for satellite broadcasting, DVB-second generation terrestrial (T2) refers to a transmission/reception standard for terrestrial broadcasting, and DVB-cable second generation (C2) refers to a transmission/reception standard for cable broadcasting. Also, DVB-next generation handheld (NGH) refers to a transmission/reception standard for next generation handheld broadcasting. Among the various forms of digital broadcasting standards described in the preceding, an example of a commonly used code may be low density parity check (LDPC) code.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a low density parity check (LDPC) decoder, including a memory configured to store a log-likelihood ratio (LLR) value of bits output from a demapper, and an LLR message exchanged between a variable node and an inspection node. The LDPC decoder further includes a node processor configured to select a decoding algorithm from a first algorithm and a second algorithm based on a code rate of an LDPC code, and decode the LLR message based on the selected decoding algorithm.

The node processor may include a variable node processor configured to add based on the LLR message, and an inspection node processor configured to compare the code rate to a preset threshold value, and select the decoding algorithm from the first algorithm and the second algorithm based on a result of the comparison.

The first algorithm may include a function F(x)-based sum-product decoding algorithm, and the second algorithm may include a min-sum decoding algorithm.

The node processor may include a controller configured to compare the code rate to a preset threshold value, select the first algorithm as the decoding algorithm in response to the code rate being less than or equal to the preset threshold value, and select the second algorithm as the decoding algorithm in response to the code rate being greater than the preset threshold value. The node processor may further include a first decoder configured to decode the LLR message based on the first algorithm in response to the first algorithm being selected, and a second decoder configured to decode the LLR message based on the second algorithm in response to the second algorithm being selected.

The first decoder and the second decoder may be configured to complementarily perform the decoding.

The first decoder may be configured to receive a d number of LLR messages, calculate a sum of function values of the respective d number of LLR messages, delay the calculated sum for a d period of time, subtract, one by one, a function value F(x) of a respective one of the d number of LLR messages from the delayed calculated sum, calculate $F^{-1}(x)$ based on a result of the subtraction, and output a result of the calculation of the $F^{-1}(x)$ as the d number of LLR messages.

The second decoder may be configured to receive a d number of LLR messages, search for a first minimum value and a second minimum value from the d number of LLR messages, select one of a first minimum value and a second minimum value, divide the selected minimum value by a first value, or add the selected minimum value to a second value, to update the d number of LLR messages, and output the updated d number of LLR messages.

In another general aspect, there is provided a method of decoding performed by a low density parity check (LDPC) decoder, the method including storing a log-likelihood ratio (LLR) value of bits output from a demapper, and an LLR message exchanged between a variable node and an inspection node. The method further includes decoding the LLR message based on a decoding algorithm selected from a first algorithm and a second algorithm based on a code rate of an LDPC code.

The decoding may include comparing the code rate to a preset threshold value, and selecting the decoding algorithm from the first algorithm and the second algorithm based on a result of the comparing.

The decoding may include comparing the code rate to a preset threshold value, selecting the first algorithm as the decoding algorithm, and decoding the LLR message based on the first algorithm, in response to the code rate being less than or equal to the preset threshold value. The decoding may further include selecting the second algorithm as the decoding algorithm, and decoding the LLR message based on the second algorithm, in response to the code rate being greater than the preset threshold value.

The decoding of the LLR message based on the first algorithm may include receiving a d number of LLR messages, calculating a sum of function values of the respective d number of LLR messages, delaying the calculated sum for a d period of time, subtracting, one by one, a function value F(x) of a respective one of the d number of LLR messages from the delayed calculated sum, calculating $F^{-1}(x)$ based on a result of the subtracting, and outputting a result of the calculating of the $F^{-1}(x)$ as the d number of LLR messages.

The decoding of the LLR message based on the second algorithm may include receiving a d number of LLR messages, searching for a first minimum value and a second minimum value from the d number of LLR messages, selecting one of a first minimum value and a second minimum value, dividing the selected minimum value by a first value, or adding the selected minimum value to a second value, to update the d number of LLR messages, and outputting the updated d number of LLR messages.

The first algorithm and the second algorithm may be configured to be complementarily selected and used to perform the decoding.

A non-transitory computer-readable storage medium may store a program including instructions to cause a computer to perform the method.

Other features and aspects will be apparent from the following detailed description, the drawings, and the claims.

Figure 1:
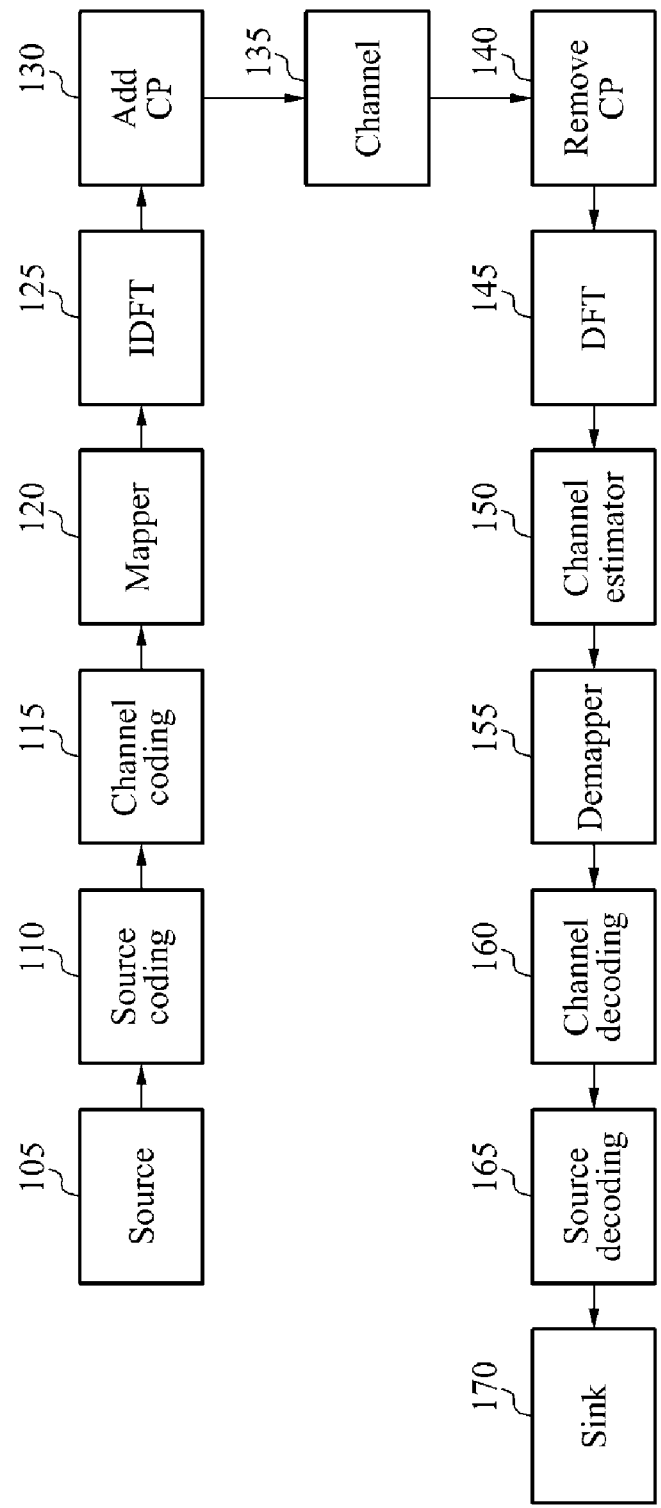
FIG. 1 is a diagram illustrating an example of a digital video broadcasting (DVB) system of a related art.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates an example of a digital video broadcasting (DVB) system of a related art. Referring to FIG. 1, blocks for a baseband of the DVB system of the related art is illustrated.

The DVB system is based on orthogonal frequency-division multiplexing (OFDM) communication, and a source block 105, for example, a first block in a transmitter, generates a data bit stream.

A source coding block 110 compresses unnecessary information in the data bit stream generated in the source block 105.

A channel coding block 115 adds, in advance, an additional parity bit to the compressed data bit stream for protecting data in order to prevent an error that is to occur in a channel 135.

A mapper block 120 maps the data bit stream added with the parity bit to a modulation symbol stream. For example, a modulation method herein may include binary phase shift keying (BPSK), quadrature phase-shift keying (QPSK), 16 quadrature amplitude modulation (QAM), and/or other methods known to one of ordinary skill in the art.

An inverse-discrete Fourier transform (IDFT) block 125 receives, in parallel, the modulation symbol stream admitted in series from the mapper block 120, and converts the modulation symbol stream into a time domain value.

A final block in the transmitter, for example, an Add CP block 130, copies, to a front, a plurality of final samples of the converted modulation symbol stream in order to avoid inter-symbol interference (ISI) amongst OFDM symbols. The plurality of copied samples is referred to as a cyclic prefix (CP).

The OFDM symbols of the time domain completed in the transmitter pass through the channel 135. For example, the plurality of copied samples is multiplied by a fading factor, and added by white Gaussian noise, in the channel 135.

A first block of a receiver, for example, a Remove CP block 140, initially removes the CP added in the Add CP block 130 of the transmitter.

A discrete Fourier transform (DFT) block 145 converts the symbol stream removed of the CP into a symbol stream of a frequency domain.

For example, one of a plurality of symbol streams received by the receiver is represented by Equation 1.

$$y = hx + n \quad \text{[Equation 1]}$$

where y denotes a symbol received by the receiver, h denotes the fading factor multiplied in the channel 135, x denotes the transmission symbol modulated in the transmitter, and n denotes the white Gaussian noise added in the channel 135.

A channel estimator block 150 estimates a fading factor of a plurality of symbol streams output from the DFT block 145.

A demapper block 155 obtains a log-likelihood ratio (LLR) value corresponding to bits of the plurality of symbol streams. For example, when the QPSK modulation method is used, the demapper block 155 generates an LLR value corresponding to two bits of a single symbol y, and transmits the generated LLR value to a channel decoding block 160.

The channel decoding block 160 decodes a plurality of actual bit values, using an LLR value for a plurality of bits. The channel decoding block 160 may include a low density parity check (LDPC) decoder or a Bose-Chaudhuri-Hochquenghem (BCH) decoder in the DVB system, and according to an example, description of an instance in which the LDPC is used is provided.

A plurality of information bit streams decoded in the channel decoding block 160 is restored to an original information bit stream from an information bit stream compressed in a source decoding block 165, and is transmitted to a final sink block 170.

The DVB system may require a channel encoder/decoder with a high reliability because the DVB system transmits high definition image data dissimilar to an instance of a general wireless communication system. Two methods may be employed in order to enhance a performance of the channel encoder/decoder.

In one of the methods, a minimum distance between a codeword and another codeword may be increased based on a code having a substantially long block length. LDPC codes of 64800 bits and 16200 bits of block length may be selected to be used in the DVB system. The LDPC code of 16200/64800 bit length is a relatively longer channel code than a block length in a range of hundreds to thousands of bits, as used in the general wireless communication system, mainly based on sound communication or communication of a small quantity of data.

Another method may use a code having a relatively low code rate. However, due to a number of restrictions in terms of a limited frequency and a data throughput to be supported, the first method may generally be used in the DVB system so as to enhance reliability of data transmission. The second method may additionally be used under inferior channel conditions.

When the LDPC code of 16200/64800 bit length is used similar to an instance of the LDPC decoder of the DVB system according to an example, complexity of a decoder may have a vast influence on the performance of the decoder. Two primary factors determining the complexity of the LDPC decoder include a size of a memory and a node processor.

The LDPC code, for example, a type of an error correction code, may not guarantee complete transmission; however, an information loss probability may be reduced as desired. The LDPC code corresponds to an error correction code most adjacent to a Shannon limit, and maintains a level greater than a predetermined level of data transmission rate.

The LDPC code may use a parity-check matrix similar to a parity-check matrix used in a Hamming code. For example, the parity-check matrix corresponds to a sparse matrix irregularly generated based on a sparsity condition.

Figure 2:
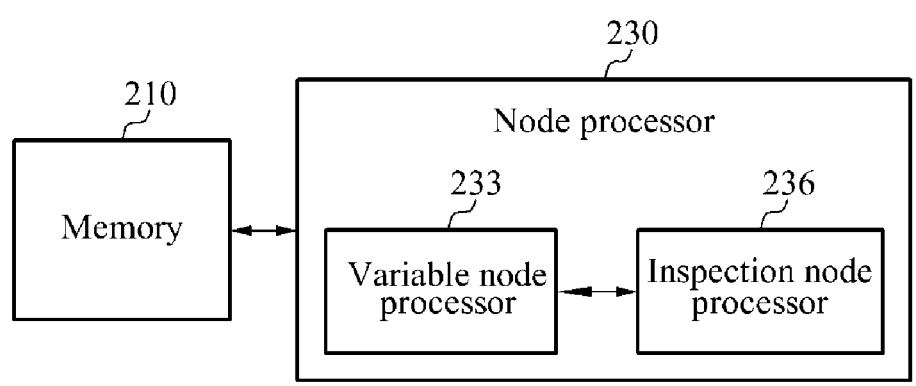
FIG. 2 is a diagram illustrating an example of a low density parity check (LDPC) decoder.

FIG. 2 illustrates an example of an LDPC decoder. Referring to FIG. 2, the LDPC decoder includes a memory 210 and a node processor 230. The node processor 230 includes a variable node processor 233 and an inspection node processor 236.

The memory 210 stores an LLR value for a plurality of bits output from a demapper, and stores LLR messages exchanged between the variable node processor 233 and the inspection node processor 236. For example, the LLR messages may be transferred via an edge between an inspection node and a variable node, and may be referred to as an LLR edge message.

The node processor 230 selects a decoding algorithm from a first algorithm and a second algorithm based on a code rate of an LDPC code, and using the selected decoding algorithm, decodes the LLR messages. As used herein, the code rate refers to a ratio of a "k" number of information points in a single block to a length "n" of the single block in a systematic code, and may be denoted by "k/n". The first algorithm includes a function F(x)-based sum-product (SP) decoding algorithm, and the second algorithm includes a min-sum decoding algorithm.

The variable node processor 233 performs a simple operation, for example, addition, on the LLR messages.

The inspection node processor 236 compares a code rate and a preset threshold value, and based on a result of the comparison, decodes the LLR messages, using the selected decoding algorithm.

Configurations of the node processor 230 will be described with reference to FIG. 4.

According to an example, the memory 210 having a relatively large size may be used to store an LLR and a decoding message of a channel code having a relatively large block size. Also, the node processor 230 may implement the variable node processor 233 and the inspection node processor 236 separately, or implement the variable node processor 233 and the inspection node processor 236 through integrating portions having two common operations into a single module. The single module operates as the variable node processor or the inspection node processor when a mode changes.

Figure 3:
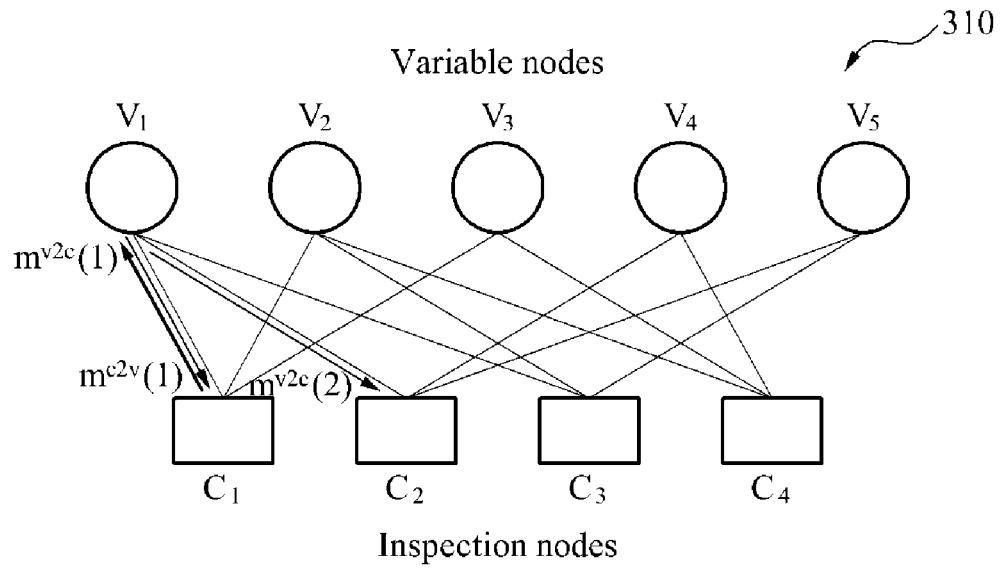
FIG. 3 is a diagram illustrating an example of a message exchanged between a variable node and an inspection node in a DVB system.
Figure 3:
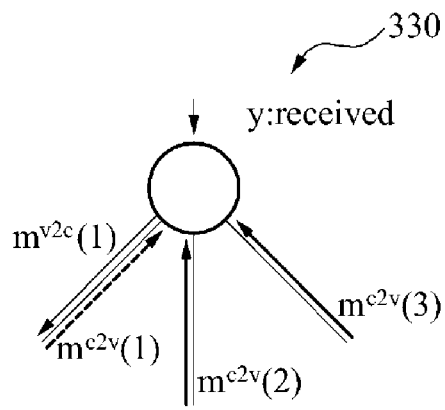
Figure 3:
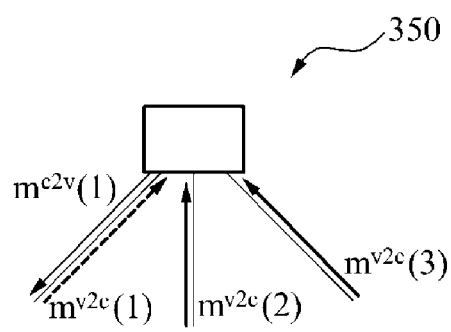

When an edge message corresponds to an LLR message, the variable node processor 233 performs relatively simple addition or an operation corresponding to an accumulator, resulting in relatively less complexity than an operation of the inspection node processor 236. The operation performed by the variable node processor 233 is expressed by Equation 2. Reference may be made to FIG. 3 for definitions of symbols given in the following mathematical equations.

$$m_{v_i \to c_j}^{(l)} = m_{v_i}^{(0)} + \sum_{c_k \in N(v_i) \setminus c_j} m_{c_k \to v_i}^{(l-1)} \qquad \text{[Equation 2]}$$

In Equation 2, $m_{v_i \to c_j}^{(l)}$ denotes an LLR message from a variable node $v_i$ to an inspection node $c_j$ in an l-th iterative decoding number of times. In addition, $m_{c_k \to v_i}^{(l-1)}$ denotes an LLR message from the inspection node $c_k$ to the variable node $v_i$. Further, $$m_{v_i}^{(0)} = \frac{2}{\sigma^2} y_i$$

denotes an initial LLR message received in a demapper, $y_i$ denotes a received symbol, $\sigma^2$ denotes a noise variance, a function $N(\bullet)$ denotes a group of neighboring nodes, and $N(\bullet)\setminus^{c_j}$ denotes a group of neighboring nodes remaining subsequent to excluding the inspection node $c_j$ from $N(\bullet)$.

When a well-known scheduling method, for example, a layered belief propagation (BP) scheduling, is used, the variable node processor 233 may be simply substituted for by a memory.

The inspection node processor 236 performs a relatively complex operation when compared to the variable node processor 233. A function may slightly change based on a form of an edge message. However, when a mostly used LLR message is assumed to be used, the operation performed by the inspection node processor 236 is simplified to Equation 3.

$$m_{c_k \to v_i}^{(l-1)} = 2 \tanh^{-1}\left( \prod_{v_k \in N(c_j) \setminus v_i} \tanh\left(\frac{m_{v_k \to c_j}^{(l)}}{2}\right) \right) \qquad \text{[Equation 3]}$$

In Equation 3, complexity of an operation may increase because tan h(x) is used, and a multiplication operation is included. When a message output to a predetermined edge in a single node is calculated, an operation may be performed except for a message admitted to the predetermined edge due to a characteristic of a BP algorithm.

For example, when four edges are connected to a single node similar to an instance of a variable node $V_2$ in FIG. 3, multiplying three values may be performed four times. Performing the multiplying of the three values four times may indicate an exponential increase in the operation based on an increase in a number of edges. Accordingly, an equation in a modified form may be used for an easier form of implementation.

$$m_{c_k \to v_i}^{(l-1)} = F^{-1}\left(\left(\sum_{i=1}^{d} F(m_{v_k \to c_j}^{(l)})\right) - F(m_{v_i \to c_j}^{(l)})\right),$$

$$F(x) = \ln \coth(x/2) = \ln \frac{e^{x/2} + e^{-x/2}}{e^{x/2} - e^{-x/2}}, F^{-1}(x) = F(x).$$

[Equation 4]

In Equation 4, two function values may be obtained through a single equation because an inverse function $F^{-1}(x)$ is identical to a an original function $F(x)$, and a number of operations may also decrease due to the absence of multiplying. Further, in Equation 4, a number of operations may decrease considerably because a number of total instances of addition may be reduced to approximately double a number of edges, through an operation in which all input values are summed up and subsequently subtracted one by one. An algorithm such as Equation 4 is referred to as a function $F(x)$-based SP algorithm.

The function $F(x)$-based SP algorithm may experience severe deterioration unless a sufficient number of bits are available when a fixed point is implemented. For example, a reason for the deterioration may be a value radically converging to infinity from zero as illustrated in a graph of the function $F(x)$, similar to a graph of $1/x$. Accordingly, when an "x" value is quantized, the function $F(x)$ may change substantially as "x" draws closer to zero, and a severe quantization error may occur. When a sufficient number of bits is available, a possibility of the quantization error occurring may be reduced due to narrowed intervals amongst the "x" values; however, implementation complexity may increase.

FIG. 3 illustrates an example of a message exchanged between a variable node and an inspection node in a DVB system. Referring to FIG. 3, an instance 310 in which variable nodes $V_1$, $V_2$, $V_3$, $V_4$, and $V_5$ and inspection nodes $C_1$, $C_2$, $C_3$, and $C_4$ exchange LLR messages via edges is illustrated.

An instance 330 indicates LLR messages input to a variable node. In detail, the LLR messages input to the variable node are represented by Equation 5.

$$m^{v2c}(j) = y + \left(\sum_{i=1}^{d} m^{c2v}(i)\right) - m^{c2v}(j)$$

[Equation 5]

In Equation 5, $m^{v2c}(j)$ denotes a message transmitted from a variable node v to an inspection node c along a j-th edge, $m^{c2v}(i)$ denotes a message transmitted from the inspection node c to the variable node v along an i-th edge. y denotes an LLR message received from a channel, and d denotes a degree of a variable node or an inspection node, for example, a number of neighboring nodes connected to a plurality of nodes or a plurality of inspection nodes.

Also, an instance 350 represents LLR messages input to an inspection node. In detail, the LLR messages input to the inspection node are defined by Equation 6.

$$m_r^{c2v}(j) = 2\tanh^{-1}\left(\Pi_{i \in N_c \setminus \{j\}} \tanh \frac{m_r^{v2c}(i)}{2}\right)$$

[Equation 6]

In Equation 6, $N_c$ denotes a group of edges connected to an inspection node c, and $N_c \setminus \{j\}$ denotes a group of edges remaining subsequent to excluding a j-th edge from $N_c$.

Figure 4:
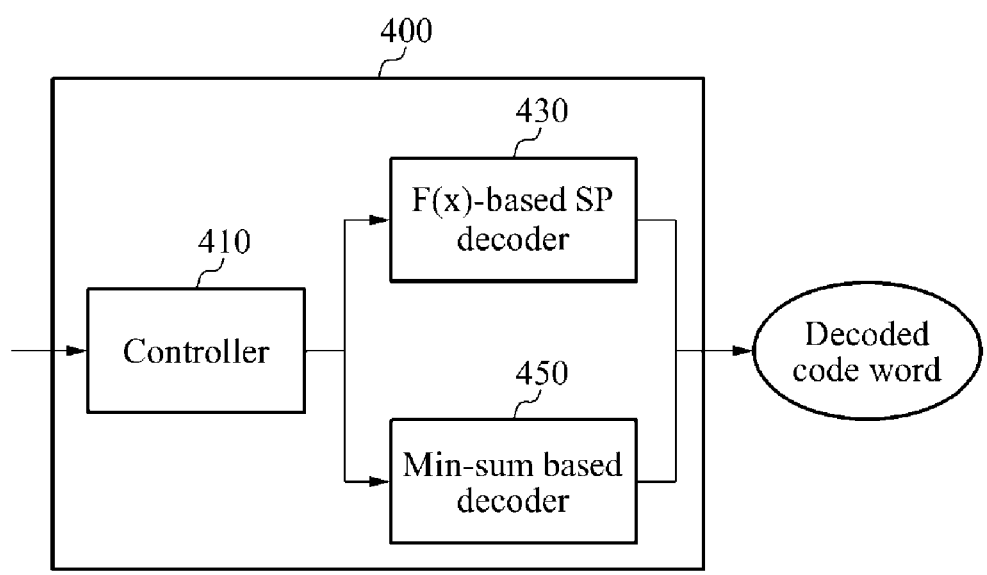
FIG. 4 is a block diagram illustrating an example of a node processor.

FIG. 4 illustrates an example of a node processor 400. Referring to FIG. 4, the node processor 400 includes a controller 410, a first decoder 430, and a second decoder 450.

The controller 410 compares a code rate of an LDPC code and a preset threshold value, and based on a result of the comparison, selects a decoding algorithm from a first algorithm and a second algorithm.

The first decoder 430 decodes the LDPC code, for example, an LLR message, using the first algorithm when the code rate is less than or equal to the preset threshold value based on the result of the comparison. The first decoder 430 refers to a function $F(x)$-based SP decoder for performing a function $F(x)$-based SP decoding algorithm, for example, the first algorithm. In FIG. 4, the decoded LDPC code is referred to as a decoded code word.

Figure 7:
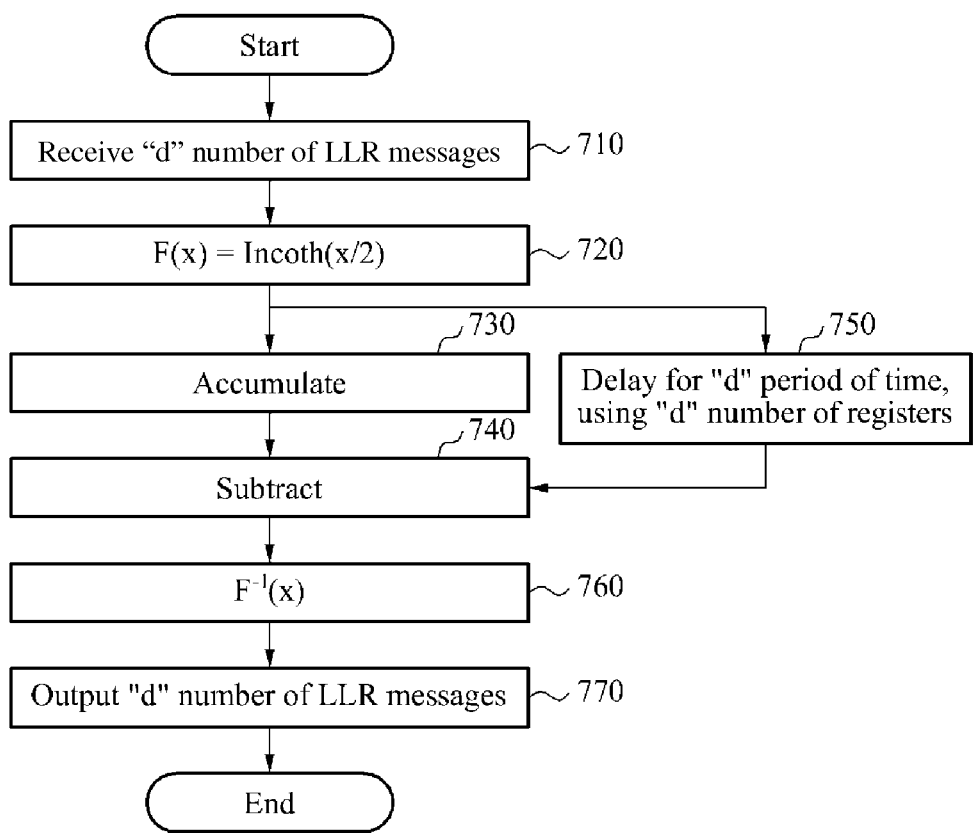
FIG. 7 is a flowchart illustrating an example of a method of decoding based on a function F(x)-based sum-product (SP) decoding algorithm performed in a node processor of an LDPC decoder.

For example, when a "d" number of edges is connected to an inspection node, the first decoder 430 decodes the LLR messages by receiving a "d" number of LLR messages, calculating a plurality of function values $F(x)=\ln \cot(x/2)$ of the "d" number of LLR messages to be accumulated one by one, delaying the plurality of function values for a "d" period of time to be subtracted one by one, and calculating and outputting $F^{-1}(x)$. Reference may be made to FIG. 7 for further description of an operation of the first decoder 430.

The second decoder 450 decodes the LDPC code, for example, an LLR message, using the second algorithm when the code rate is greater than the preset threshold value based on the result of the comparison performed by the controller 410. The second decoder 450 refers to a min-sum based decoder for performing a min-sum based decoding algorithm, for example, the second algorithm.

Figure 8:
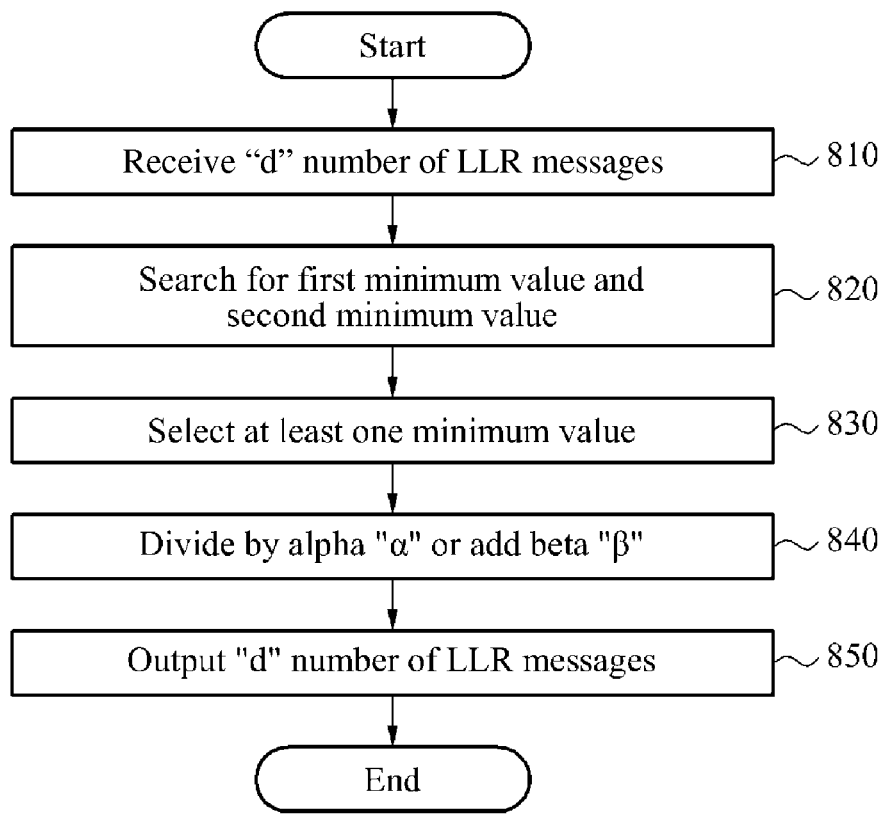
FIG. 8 is a flowchart illustrating an example of a method of decoding based on a min-sum based decoding algorithm performed in a node processor of an LDPC decoder.

For example, when a "d" number of edges is connected to an inspection node, the second decoder 450 decodes the LLR messages by receiving a "d" number of LLR messages, and outputting through dividing a minimum value selected from a first minimum value and a second minimum value with respect to the "d" number of LLR messages by a first value, or adding a second value to the selected minimum value. Reference may be made to FIG. 8 for further description of an operation of the second decoder 450.

The first decoder 430 and the second decoder 450 may complementarily perform the decoding. The first decoder 430 and the second decoder 450 include a variable node processor and an inspection node processor, respectively.

Figure 5:
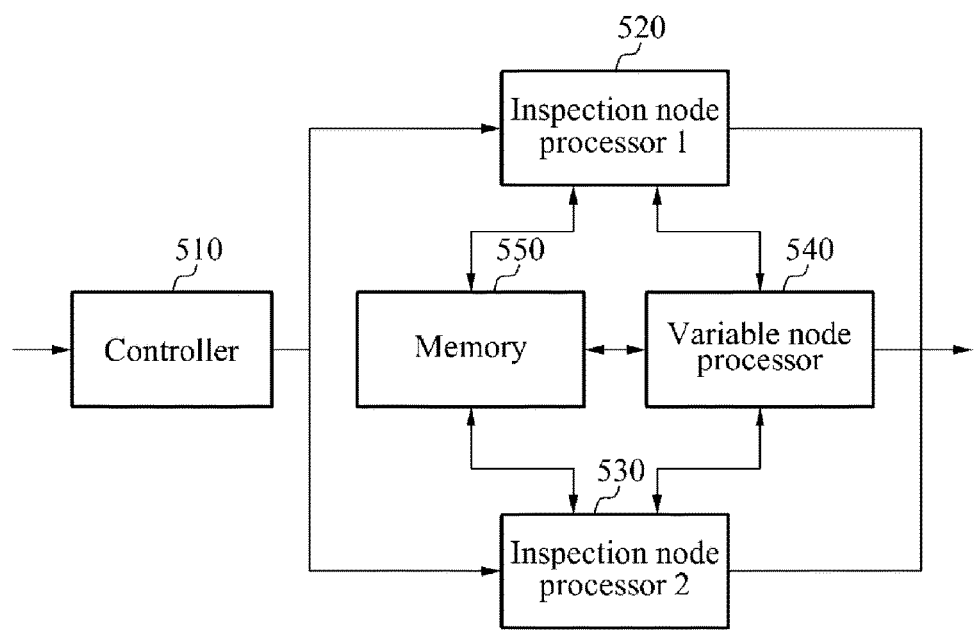
FIG. 5 is a block diagram illustrating another example of a node processor.

FIG. 5 illustrates another example of a node processor 500. Referring to FIG. 5, the node processor 500 includes a controller 510, an inspection node processor 1 520, an inspection node processor 2 530, a variable node processor 540, and a memory 550. For example, the memory 550 may be included in the node processor 500 as shown in FIG. 5, or disposed externally, and may be similar to the memory 210 of FIG. 2.

The controller 510 compares a code rate and a preset threshold value, and based on a result of the comparison, selects a decoding algorithm from a first algorithm and a second algorithm.

The inspection node processor 1 520 decodes an LLR message, using a function F(x)-based SP algorithm when the code rate is less than or equal to the preset threshold value based on a result of the comparison performed by the controller 510, similar to the inspection node processor included in the function F(x)-based SP decoder 430 of FIG. 4.

The inspection node processor 2 530 decodes an LLR message, using a min-sum algorithm when the code rate is greater than the preset threshold value based on the result of the comparison performed by the controller 510, similar to the inspection node processor included in the min-sum based decoder 450 of FIG. 4.

The variable node processor 540 performs addition amongst or using LLR messages, and a result of the addition may be shared by the inspection node processor 1 520 and the inspection node processor 2 530.

Figure 6:
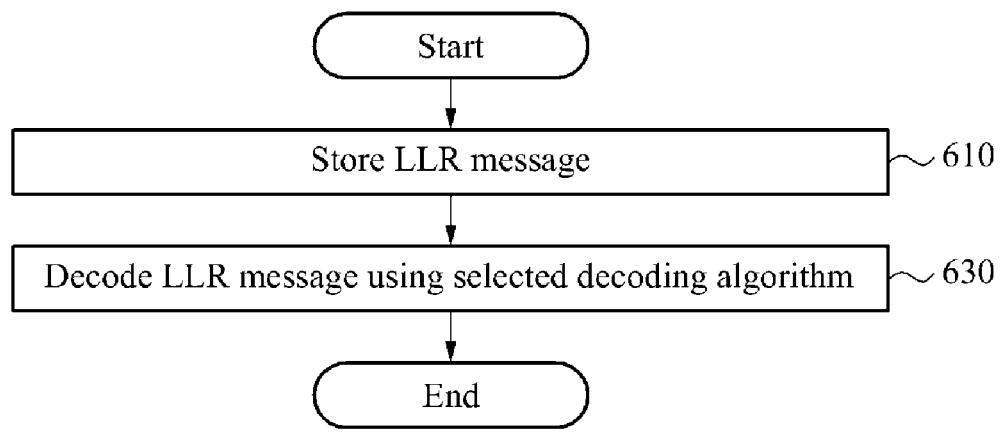
FIG. 6 is a flowchart illustrating an example of a method of decoding performed by an LDPC decoder.

FIG. 6 illustrates an example of a method of decoding performed by an LDPC decoder. Referring to FIG. 6, in operation 610, the LDPC decoder stores an LLR message exchanged between a variable node and an inspection node. The LDPC decoder stores an LLR value of a plurality of bits output from a demapper.

In operation 630, the LDPC decoder decodes the LLR message, using a decoding algorithm selected from a first algorithm and a second algorithm based on a code rate of an LDPC code. In detail, the LDPC decoder compares the code rate and a preset threshold value, and based on a result of the comparison, selects the decoding algorithm from the first algorithm and the second algorithm. The LDPC decoder uses the selected decoding algorithm to decode the LLR message. The first algorithm includes a function F(x)-based SP decoding algorithm, and the second algorithm includes a min-sum based decoding algorithm.

For example, when the code rate is less than or equal to the preset threshold value, the LDPC decoder selects the function F(x)-based SP decoding algorithm, and decodes the LLR message, using the function F(x)-based SP decoding algorithm. A method of decoding, by the LDPC decoder, the LLR message, using the function F(x)-based SP decoding algorithm, is described with reference to FIG. 7.

Also, when the code rate is greater than the preset threshold value, the LDPC decoder selects the min-sum based decoding algorithm, and using the min-sum decoding algorithm, decodes the LLR message. A method of decoding, by the LDPC decoder, the LLR message, using the min-sum based decoding algorithm is described with reference to FIG. 8.

FIG. 7 illustrates an example of a method of decoding based on a function F(x)-based SP decoding algorithm performed in a node processor of an LDPC decoder. Referring to FIG. 7, the method in which the node processor performs the function F(x)-based SP decoding algorithm when a "d" number of edges is connected to an inspection node is illustrated.

In operation 710, the node processor receives a "d" number of LLR messages input via a plurality of inspection nodes.

In operation 720, the node processor calculates a function value F(x)=ln cot(x/2) of each of the "d" number of LLR messages.

In operation 730, the node processor accumulates function values one by one in an accumulator, and calculates a sum of results of the calculation of the function values.

In operation 750, the node processor delays the calculated sum for a "d" clock period of time, using a "d" number of registers.

In operation 740, the node processor subtracts, one by one, the function value F(x) of a respective one of the "d" number of LLR messages from the calculated sum delayed for the "d" clock period of time.

In operation 760, the node processor performs an $F^{-1}(x)$ operation based on a result of the subtraction.

In operation 770, the node processor outputs a result of the $F^{-1}(x)$ operation as the "d" number of LLR messages.

For example, a reason for the delaying of the calculated sum for the "d" clock period of time is that all of input function values need to be accumulated and subsequently subtracted one by one from the calculated sum, because a number of the input function values of the LLR messages is "d". Accordingly, the node processor accumulates the LLR message input function values one by one during an initial "d" clock. During a subsequent "d" clock, the node processor subtracts one data after another from the calculated sum as described in operation 740, and converts the number of the LLR message input function values into the "d" number of LLR messages via $F^{-1}(x)$ as described in operation 760. The node processor outputs the "d" number of LLR messages during a final "d" clock.

As described in the preceding, an operation using the F(x) may store an F(x) value, and the greater a number of bits, the greater complexity of implementation. Thus, according to an example, a message update equation of an inspection node is simplified to Equation 7. Equation 7 is an update equation of an inspection node for calculating a message output to a single edge when a number of edges is three.

$$y = 2\tanh^{-1}\left(\tanh\frac{m_1}{2}\tanh\frac{m_2}{2}\right) \quad \text{[Equation 7]}$$

$$= \text{sgn}(m_1)\text{sgn}(m_2)\min\{|m_1|, |m_2|\} + \ln\left(\frac{1+e^{-|m_1|,|m_2|}}{1+e^{-|m_1|,|m_2|}}\right)$$

$$= \text{sgn}(m_1)\text{sgn}(m_2)\min\{|m_1|, |m_2|\}/\alpha + \beta$$

In Equation 7, $m_1$ and $m_2$ denote LLR message inputs, and y denotes LLR message outputs. Also, sgn(x) denotes a function having a sine value, and has a value of "+1" when "x" is greater than or equal to zero, and has a value of "4" when "x" is less than zero.

In Equation 7, a second equation is a simplified equation to be applied to an instance in which a number of LLR message inputs is two. When the number of LLR message inputs is greater than three, a number of operations may increase compared to the operation in which all of the LLR message inputs are summed up and subsequently subtracted one by one, using the F(x), because the operation needs to be performed one after another in a group of two. However, the second equation may be used to obtain a well-known min-sum algorithm.

In Equation 7, a third equation is an equation representing a min-sum algorithm or a corrected min-sum algorithm. An "ln" function, for example, a term to be added in the second equation, refers to a value determined based on $m_1$ and $m_2$. The "ln" function may be simplified through being divided by "α" greater than "1" or adding a constant value "β" based on $m_1$ and $m_2$ as represented in the third equation. For example, when "β" is zero, the third equation is referred to as a normalized min-sum algorithm, and when "α" is "1", the third equation is referred to as an offset min-sum algorithm. In the normalized min-sum algorithm, the third equation may be divided by "α" in an approximate range of 1.2 to 1.3, and "α" may vary based on channel conditions or a code rate.

Equation 8 defines "β" according to an example of the offset min-sum algorithm.

$$\beta = \begin{cases} 0.5 & \text{if } |m_1 + m_2| \leq 1 \text{ and } |m_1 - m_2| > 1 \\ -0.5 & \text{if } |m_1 + m_2| > 1 \text{ and } |m_1 - m_2| \leq 1 \\ 0 & \text{otherwise} \end{cases}$$

$$= \begin{cases} 0.5 & \text{if } |m_1 + m_2| < 2 \text{ and } |m_1 - m_2| > 2|m_1 + m_2| \\ -0.5 & \text{if } |m_1 + m_2| < 2 \text{ and } |m_1 + m_2| > 2|m_1 - m_2| \\ 0 & \text{otherwise} \end{cases}$$

[Equation 8]

In the offset min-sum algorithm, performance efficiency may be greater than the normalized min-sum algorithm in general; however, "β" to be added may be determined based on $m_1$ and $m_2$, similar to the "ln" function of the second equation. Accordingly, when a number of inputs increases to a greater number, complexity may decrease, albeit to a small extent, compared to an instance of using the "ln" function because a serial operation needs to be performed several times.

In the normalized min-sum algorithm, despite a presence of a plurality of inputs, only a first minimum value and a second minimum value may be obtained for a result of the operation of the first minimum value and the second minimum value to be reused, and complexity may decrease using "α" fixed on the same value.

FIG. 8 illustrates an example of a method of decoding based on a min-sum based decoding algorithm performed in a node processor of an LDPC decoder. Referring to FIG. 8, the node processor performs a min-sum algorithm including a corrected min-sum algorithm.

In operation 810, the node processor receives a "d" number of LLR messages.

In operation 820, the node processor searches for a first minimum value and a second minimum value from the "d" number of LLR messages. For example, a reason the node processor searches for the first minimum value and the second minimum value is that an output value is calculated using the second minimum value rather than the first minimum value in an output to an edge to which an LLR message corresponding to the first minimum value is input among a "d" number of edges. Also, in an output to edges, aside from the edge to which the LLR message corresponding to the first minimum value is input, an output value may be calculated using the first minimum value.

In operation 830, the node processor selects at least one minimum value from a first minimum value and a second minimum value, using a minimum value selector. Also, the node processor determines whether a provided edge is the edge to which the first minimum value is admitted, and selects the first minimum value or the second minimum value.

In operation 840, the node processor divides the selected at least one minimum value by a first value, for example, "α", or adds a second value, for example, "β", to the selected at least one minimum value, to update the "d" number of LLR messages. Also, the node processor may divide a minimum value obtained based on an algorithm by a first value, for example, "α", or may add a second value, for example, "β", to the minimum value.

In operation 850, the node processor outputs the updated "d" number of LLR messages subsequent to operation 840 being performed.

The various blocks, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A low density parity check (LDPC) decoder in a digital video broadcasting (DVB) system in a digital video broadcasting (DVB) system, comprising:
    a memory configured to store a log-likelihood ratio (LLR) value of bits output from a demapper, and an LLR message exchanged between a variable node and an inspection node; and
    a node processor configured to
        compare a code rate of an LDPC code to a threshold value,
        select a function F(x)-based sum-product decoding algorithm as a decoding algorithm in response to the code rate being less than or equal to the threshold value,
        select a min-sum decoding algorithm as the decoding algorithm in response to the code rate being greater than the threshold value, and
        decode the LLR message based on the selected decoding algorithm, wherein the node processor comprises one or more decoders configured to
        decode the LLR message based on the function F(x)-based sum-product decoding algorithm in response to the function F(x)-based sum-product decoding algorithm being selected,
        decode the LLR message based on the min-sum decoding algorithm in response to the min-sum decoding algorithm being selected, and
        wherein the one or more decoders are configured to complementarily perform the decoding.

2. The LDPC decoder of claim 1, wherein a first decoder for the function F(x)-based sum-product decoding algorithm is configured to:
    receive a d number of LLR messages;
    calculate a sum of function values of the d number of LLR messages;
    delay the calculated sum for a d period of time;
    subtract, one by one, a function value F(x) of each of the d number of LLR messages from the delayed calculated sum;
    calculate $F^{-1}(x)$ based on a result of the subtraction; and
    output a result of the calculation of the $F^{-1}(x)$ as the d number of LLR messages.

3. The LDPC decoder of claim 1, wherein a second decoder for the min-sum decoding algorithm is configured to:
    receive a d number of LLR messages;
    search for a first minimum value and a second minimum value from the d number of LLR messages;
    select one of the first minimum value and the second minimum value;
    divide the selected minimum value by a first value, or add the selected minimum value to a second value, to update the d number of LLR messages; and
    output the updated d number of LLR messages.

4. A method of decoding performed by a low density parity check (LDPC) decoder in a digital video broadcasting (DVB) system, the method comprising:
    storing a log-likelihood ratio (LLR) value of bits output from a demapper, and an LLR message exchanged between a variable node and an inspection node;
    comparing a code rate to a threshold value;

selecting a function F(x)-based sum-product decoding algorithm as a decoding algorithm in response to the code rate being less than or equal to the threshold value;

selecting a min-sum decoding algorithm as the decoding algorithm in response to the code rate being greater than the threshold value;

decoding, using one or more decoders, the LLR message based on the function F(x)-based sum-product decoding algorithm in response to the function F(x)-based sum-product decoding algorithm being selected; and decoding, using one or more decoders, the LLR message based on the min-sum decoding algorithm in response to the min-sum decoding algorithm being selected, wherein the one or more decoders complementarily perform the decoding.

5. The method of claim 4, wherein the decoding of the LLR message based on the function F(x)-based sum-product decoding algorithm comprises:

receiving a d number of LLR messages;

calculating a sum of function values of the d number of LLR messages;

delaying the calculated sum for a d period of time;

subtracting, one by one, a function value F(x) of each of the d number of LLR messages from the delayed calculated sum;

calculating $F^{-1}(x)$ based on a result of the subtracting; and outputting a result of the calculating of the $F^{-1}(x)$ as the d number of LLR messages.

6. The method of claim 4, wherein the decoding of the LLR message based on the min-sum decoding algorithm comprises:

receiving a d number of LLR messages;

searching for a first minimum value and a second minimum value from the d number of LLR messages;

selecting one of the first minimum value and the second minimum value;

dividing the selected minimum value by a first value, or adding the selected minimum value to a second value, to update the d number of LLR messages; and outputting the updated d number of LLR messages.

7. A non-transitory computer-readable storage medium storing instructions that, when executed by a processor, cause the processor to perform the method of claim 4.

* * * * *